(12) United States Patent
Tiemeijer et al.

(10) Patent No.: US 8,859,966 B2
(45) Date of Patent: Oct. 14, 2014

(54) SIMULTANEOUS ELECTRON DETECTION

(75) Inventors: Peter Christiaan Tiemeijer, Eindhoven (NL); Bert Henning Freitag, Eindhoven (NL); Sorin Lazar, Eindhoven (NL)

(73) Assignee: FEI Company, Hillsboro, OR (US)

( * ) Notice: Subject to any disclaimer, the term of this patent is extended or adjusted under 35 U.S.C. 154(b) by 398 days.

(21) Appl. No.: 13/106,726

(22) Filed: May 12, 2011

(65) Prior Publication Data

US 2011/0278451 A1 Nov. 17, 2011

Related U.S. Application Data

(60) Provisional application No. 61/333,832, filed on May 12, 2010.

(30) Foreign Application Priority Data

May 21, 2010 (EP) .................................... 10163505

(51) Int. Cl.
H01J 37/26 (2006.01)
H01J 37/28 (2006.01)
H01J 37/05 (2006.01)

(52) U.S. Cl.
CPC ........... H01J 37/05 (2013.01); H01J 2237/057 (2013.01); H01J 2237/2802 (2013.01); H01J 2237/2804 (2013.01); H01J 37/28 (2013.01)
USPC ............ 250/311; 250/306; 250/307; 250/310

(58) Field of Classification Search
USPC .................................. 250/306, 307, 310, 311
See application file for complete search history.

(56) References Cited

U.S. PATENT DOCUMENTS

| | | | |
|---|---|---|---|
| 5,798,524 A * | 8/1998 | Kundmann et al. ........... | 250/305 |
| 6,150,657 A | 11/2000 | Kimoto et al. | |
| 6,794,648 B2 * | 9/2004 | Kaji et al. .................... | 250/311 |
| 6,855,927 B2 | 2/2005 | Taniguchi et al. | |
| 7,105,816 B2 | 9/2006 | Kamiya et al. | |
| 7,250,599 B2 | 7/2007 | Funnemann et al. | |
| 7,355,177 B2 | 4/2008 | Kamiya et al. | |
| 2006/0163479 A1 * | 7/2006 | Kaji et al. ..................... | 250/310 |
| 2009/0133167 A1 | 5/2009 | Yakushevska et al. | |

FOREIGN PATENT DOCUMENTS

JP 7021966 1/1995

OTHER PUBLICATIONS

Gubbens et al., The GIF quantum, a next generation post-column imaging energy filter, Ultramicroscopy(2010), Journal Homepage: www.elsevier.com/locate/ultramic, Gatan Research and Development, California, US (9 pgs).

Krivanek et al., "Developments in EELS instrumentation for Spectroscopy and Imaging", Gatan Research and Development, California, US, Apr./Jun. 1991, p. 315-332, (18 pgs).

Egerton, RF, "Electron energy-loss spectroscopy in the TEM," Reports on Progress in Physics, Dec. 16, 2008, pp. 1-25.

* cited by examiner

*Primary Examiner* — Nicole Ippolito
*Assistant Examiner* — Hanway Chang
(74) *Attorney, Agent, or Firm* — Scheinberg & Associates, PC; Michael O. Scheinberg

(57) ABSTRACT

The invention provides multiple detectors that detect electrons that have passed through a sample. The detectors preferably detect electrons after the electrons have been passed through a prism that separates electrons according to their energies. Electrons in different energy ranges are then detected by different detectors, with preferably at least one of the detectors measuring the energy lost by the electrons as they pass through the sample. One embodiment of the invention provides EELS on core-loss electrons while simultaneously providing a bright-field STEM signal from low-loss electrons.

15 Claims, 8 Drawing Sheets

SIMULTANEOUS ELECTRON DETECTION

This application claims priority from U.S. Provisional Pat. App. 61/333,832, filed May 12, 2010, which is hereby incorporated by reference.

TECHNICAL FIELD OF THE INVENTION

The present invention relates to detectors for electron beam system, and in particular, to simultaneously detecting electrons in different energy ranges using different detectors.

BACKGROUND OF THE INVENTION

In a scanning transmission electron microscope (STEM), a focused beam of high-energy electrons is scanned across a thin sample. Electrons in the beam interact with the sample as they pass through it and are collected below the sample. Some electrons pass through the sample relatively unhindered; others are deflected, absorbed, or lose energy. Different imaging and analysis techniques use different characteristics of the transmitted electrons to form an image or to determine properties of the sample. The term "STEM imaging" is used herein to refer to obtaining information about the sample from the number of the electrons impacting a detector as a focused electron beam is scanned along the sample surface. A "STEM detector" used in STEM imaging may be a scintillator-photomultiplier detector, known as an Everhart-Thornley detector, a PIN solid state detector, or any other suitable detector. A STEM detector is typically sufficiently fast to allow data collection as the primary electron beam scans a region of the sample surface. A typical scan, for example rastering the beam over a thousand rows with a thousand scan points in each row, may take about one second and can generate over a million pixels of information, and so the detector preferably can provide readings at a rate of at least one million readings per second. A typical high accuracy STEM imaging circuit can obtain a reading in microseconds, preferably less than 100 µs, less than 50 µs, and more preferably less than 10 µs.

Electrons that pass through the sample without a large change in direction can be detected along the beam axis in a process referred to as "bright-field STEM imaging." Electrons that are deflected through larger angles by the sample can be collected away from the optical axis in a process referred to as "dark-field STEM imaging." Electrons for bright-field and dark-field STEM imaging can be detected by detectors that produce a signal proportional to the number of impinging electrons. A STEM detector for bright-field imaging is typically circular and centered on the system optical axis. A STEM detector used for dark-field imaging is typically annular and concentric with the axis. Information from bright-field imaging or dark-field imaging collected at each point in the scan of the primary electron beam can be used separately or together to provide an image or to map a characteristic of the sample.

In another mode of imaging, so-named TEM imaging, the sample is irradiated with a parallel beam of electrons. Again, part of the electrons pass through the sample relatively unhindered; others are deflected, absorbed, or lose energy. An image of the sample is formed on a detector, the detector in the form of e.g. a fluorescent screen, a CMOS camera, a CCD camera, or any other suitable detector.

It is noted that many instruments are capable to form TEM images and STEM images.

Additional information about the sample can be provided by measuring the energy absorbed as electrons pass though the sample. This technique is called "electron energy-loss spectroscopy" or EELS. An overview of EELS is provided by R. F. Egerton in "Electron energy-loss spectroscopy in the TEM," *Reports on Progress in Physics* 72 (December 2008). Different materials in the sample cause electrons to lose different amounts of energy as they pass through. The electrons pass through a spectrometer to determine the energy loss by subtracting their exiting energy from the electron energy in the original electron beam. EELS can determine not only which elements are present, but also their chemical states.

An EELS spectrometer typically includes one or more prisms that separate electrons by their energies in an energy-dispersive plane by deflecting the electrons by an amount that depends on the electron energy. An energy dispersive plane is a plane in which electrons having different energies are dispersed in a direction normal to the direction of the beam travel. The term "prism" as used herein means any device that disperses the electron beam depending on the energies of electrons in the beam. A prism can provide, for example, a magnetic or electric field perpendicular to the beam. For example, a portion of a spherical capacitor, a magnetic deflector, or a Wien filter can be used as a prism. The angular dispersion of the electrons depends on the strength of the magnetic or electric field in the prism and the energy of the electrons. A prism may comprise multiple elements. Beside a prism, an EELS spectrometer may also include an adjustable energy-selecting slit, typically positioned in or near the energy-dispersive plane, and imaging optics that may include a system of prisms and/or lenses and/or multipoles or combinations thereof, to form an electron image on a detector that records the image. The detector can be, for example, a charged coupled device or active pixel sensor and may include a row or a two-dimensional array of pixels. Projection optics positioned after the sample and before the spectrometer project electrons into the entrance aperture of the spectrometer.

Typically, EELS spectrometers can be operated in two modes. In the first mode, called the "spectroscopy mode," the imaging optics form an image of the energy-dispersive plane on the detector. In this way, the image on the detector constitutes a spectrum of the energy lost in the specimen. The system of prisms and/or lenses and/or multipoles between the energy dispersive plane and the detector can be used to vary the magnification of the energy-dispersive plane on the detector. Low magnifications can be used to image an overview of the spectrum, and high magnifications can be used to image details in the spectrum. In this mode, the energy-selecting slit is usually not needed, and it is set sufficiently wide that its shadow is not visible on the detector.

In the second mode of operation of EELS spectrometers, called the "energy-selected" or "energy-filtered" imaging mode, the imaging optics form an image of the entrance plane of the spectrometer on the detector. The projection optics between the sample and the spectrometer can be set so that the entrance plane of the spectrometer contains a TEM image of the sample, and then the detector plane contains again a TEM image of the sample. Alternatively, the projection optics can be set so that the entrance plane of the spectrometer contains an image of the back-focal plane of the first lens after the sample, which image is commonly referred to as a diffraction pattern of the sample. The energy-selecting slit can be used to form a TEM image or diffraction pattern on the detector which is formed only by electrons which have lost a specific amount of energy passing through the sample.

Some EELS spectrometers cannot operate in this second mode (for example, because the detector is not capable of recording two-dimensional images, or because the system of lenses or multipoles is not flexible enough to form an image of the entrance plane), and therefore these EELS spectrometers do not require an energy-selecting slit.

There are several mechanisms by which electrons lose energy as they pass through a sample. The different mechanisms cause electrons to lose different amounts of energy and account for the shape of a typical energy loss graph or spectrum. FIGS. 1A and 1B are spectra that show in arbitrary units numbers of electrons detected at various energy loss values. The energy loss spectrum varies with the material present in the sample and so information about the sample can be inferred from the spectrum.

FIG. 1A shows the so-called "low-loss" region 100 of the energy loss spectrum, which is defined somewhat arbitrarily as regions of less than 100 eV. Electron losses in the low-loss region result primarily from inelastic interactions, such as phonon interactions, plasmon interactions, collisions with outer shell electrons, non-ionizing collisions with inner shell electrons, and radiation losses. FIG. 1B shows a typical "core loss" region 108 of the spectrum. Electron losses in the core-loss region result from ionization of inner shell or "core" electrons and losses are typically greater than 100 eV. The spectra of FIG. 1A and FIG. 1B are not drawn to the same scale; the vertical scale of FIG. 1B is much enlarged compared to FIG. 1A.

FIG. 1A shows a large peak 102, called the "zero-loss peak," centered on zero energy loss. It is typically about 0.2 eV to 2 eV wide and represents primarily the energy spread in the original beam and small energy losses that occur in predominantly elastic collisions between the beam electrons and atomic nuclei. A broad plasmon peak 104 is caused by a resonance of the beam electrons with the valence electrons. FIG. 1B shows peaks 110, 112, and 114 having much higher energy losses that than those shown in FIG. 1A. Each peak is associated with the removal of a specific inner shell electron and the peak is characteristic of the specific sample material. The core loss spectrum provides information that readily identifies materials present in the sample, although information about the sample is also available from low-loss regions of the energy loss spectrum.

FIG. 2A shows a scanning transmission electron microscopic 200 that can simultaneously detect dark-field electrons 202 and perform EELS on bright-field electrons 204. Microscope 200 includes an electron source 210 and a focusing column 212 that focuses electrons from source 210 into a small spot and scans the spot across a thin sample 214. The beam is composed of high energy electrons, that is, electrons having typical energies of between about 50 keV and 1,000 keV. Electrons that pass through sample 214 enter projection optics 216. Projection optics 216 can be set to form a magnified image of the sample 214 at the entrance plane of a spectrometer 217, or to form a diffraction pattern at the entrance plane of the spectrometer 217. For STEM applications, projection optics 216 are typically adjusted to form a diffraction pattern at the entrance plane of the spectrometer so that bright-field electrons 204, which passed through the sample with minimal deflection, pass through an entrance aperture 215 and enter spectrometer 217, while dark-field electrons 202, which were more strongly deflected by the sample, are detected by an annular dark-field STEM detector 218. A signal from annular STEM detector 218 is amplified by an amplifier 220. The annular STEM detector 218 is typically a scintillator-photomultiplier detector or a solid state PIN detector. Bright-field electrons 204 pass through the center hole of annular STEM detector 218 and into spectrometer 217, which includes a prism 222 that disperses the electrons according to their energies into different trajectories 224a, 224b . . . 224e, etc.

Electrons are spread vertically according to their energies in an energy dispersive plane 225. A microscope that is capable of operating in the energy selected imaging mode described above includes an energy-selecting slit 226, having an upper knife edge 226U and a lower knife edge 226L, positioned at or near energy dispersive plane 225. The space between the knife edges is adjustable to pass electrons having energies within different ranges. Electrons 230 that pass through energy-selecting slit 226 are focused by imaging optics 232 onto a detector 234, such as a film, a fluorescence screen, a CCD detector, or an active pixel sensor. Electrons 236 having energies outside the specified range are blocked by energy-selecting slit 226.

Annular detector 218 does not interfere with the bright-field electrons 204 entering the prism 222 because of the annular shape of STEM detector 218 blocks only electrons away from the beam axis. Such a system was not considered suitable for STEM detection of bright-field electrons while simultaneously performing EELS because the bright-field detector and its supports would block the electron beam from entering the prism.

FIG. 2B shows another scanning transmission electron microscopic 248 that can simultaneously detect dark-field electrons 202 and perform EELS on bright-field electrons 204. Microscope 248 includes a spectrometer 250 configured as an "in-column" spectrometer, as opposed to spectrometer 217 of FIG. 2A, which is configured as a "post column" spectrometer. In an "in-column" spectrometer, electrons leave the spectrometer parallel to the direction at which the electrons entered. Spectrometer 250 includes for a prism an "omega filter" that typically includes at least four elements 252A, 252B, 252C and 252D. Elements 252A and 252B offset the electron path and disperse the electron beam. Elements 252C and 252D further disperse the electron beam and displace the beam back to the original optical axis. The symmetry between the first half of the omega filter consisting of elements 252A and 252B and the second half of the omega filter consisting of elements 252C and 252D are configured to cause several aberrations of the prisms to cancel. The dispersive actions of these two halves of the omega filter do not cancel and create an energy dispersive plane 254 after element 252D. In this plane, energy-selecting slits 256L and 256R are positioned. Electrons 260 that exit element 252D are focused by imaging optics 232 onto a detector 234.

It can be noted that both the "low-loss region" and the "core-loss region" contain both bright-field and dark-field electrons, so the electrons that exit the sample can be divided in four categories: bright-field low-loss electrons, dark-field low-loss electrons, bright-field core-loss electrons, and dark-field core-loss electrons. The "zero-loss peak" refers to energy loss and not to deflection angle, and so "zero-loss electrons" are not the same as "bright-field" electrons. For example, electrons that are elastically scattered by atomic nuclei lose very little energy but may be scattered at very large angles. Electrons from all four categories can be used to provide information about the sample. The typical fractions of electrons in the above categories are ~95%, ~5%, ~1%, and ~0.05%, respectively. Thus, in a typical microscope operation, the bright-field low-loss electrons are the largest fraction of the exiting beam, and the dark-field core-loss electrons are the smallest fraction of the exiting beam. Because the dark-field EELS signal is typically 10 to 100 times smaller than the bright-field EELS signal, the dark-field contribution to the EELS signal is usually neglected. In a typical microscope operation, the projection system between the sample and the annular STEM detector is set so that the dark-field electrons strike the annular STEM detector, and the bright-field core-loss electrons are recorded by the spectrometer. Also, the entrance aperture of the spectrometer normally only passes the bright-field electrons, so the spectrometer records a bright-field EELS signal. The term "EELS" is used herein in its ordinary meaning to refer primarily to bright-field EELS.

SUMMARY OF THE INVENTION

An object of the invention is to provide multiple simultaneous analyses in a scanning transmission electron microscope, where the multiple analyses include energy loss spectroscopy and STEM imaging.

A preferred embodiment includes at least two detectors positioned after a prism, one detector detects electrons having energies within a first energy range and the other detector detects electrons within a second energy range. One of the two detectors preferably determines the energy loss of the detected electrons. For example, a preferred embodiment is capable of determining an energy loss spectrum for core-loss electrons, while simultaneously providing additional information about the sample from the low-loss electrons.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Embodiments of the invention provide multiple detectors that detect electrons that have passed through a sample. The detectors preferably detect electrons after the electrons have been passed through a prism or a multitude of prisms that separate electrons according to their energies. Electrons in different energy ranges are then detected by different detectors, with preferably at least one of the detectors measuring the energy lost by the electrons as they pass through the sample.

Some embodiments detect bright-field low-energy-loss electrons as a surrogate for bright-field electrons thus permitting bright-field STEM information to be provided simultaneously with EELS. Such embodiments reduce the time required to collect information about the sample and reduce the dose, that is, the total number of electrons that impinge on and potentially damage the sample. For example, a user can quickly scan a specimen using bright-field STEM mode to obtain information about strain or, more generally, crystallographic information, which is typically not accessible in dark-field STEM, while simultaneously observing the EELS spectrum to check for the presence of some atomic element.

The STEM detector is preferably placed in or near an energy-dispersive plane. When the microscope includes an energy-selecting slit, the energy-selecting slit is also typically placed in or near the energy-dispersive plane, and the STEM detector is preferably placed before the energy-selecting slit. The slit itself can be used as a detector in some embodiments. The prism is adjusted to determine which part of the spectrum enters the imaging optics and which part of the spectrum impinges upon a STEM detector before the imaging optics. For example, the prism can be adjusted so that electrons in the low-loss region impinge on a STEM detector positioned off of the optical axis and before the imaging optics while electrons in the part of the core-loss region enter the energy-selecting slit. This adjustment can provide bright-field STEM data and core-loss EELS data simultaneously. Alternatively, the prism can be adjusted so that electrons in the low-loss region enter the imaging optics, while electrons in the core-loss region impinge on a STEM detector. In this embodiment, the STEM detector is positioned before the imaging optics and offset on the opposite side of the optical axis than the STEM detector used to detect electrons in the low-loss region of the spectrum. This adjustment can provide core-loss bright-field STEM data and low-loss EELS data simultaneously.

The energy of electrons leaving the prism along its axis is readily adjustable by changing the excitation of the prism, for example, by changing the current in a magnetic prism or the voltage on an electrostatic prism. The STEM detector can be made sufficiently long in the direction of the energy dispersion to detect a desired energy range and can be positioned to detect the desired energy values.

Figure 1A:
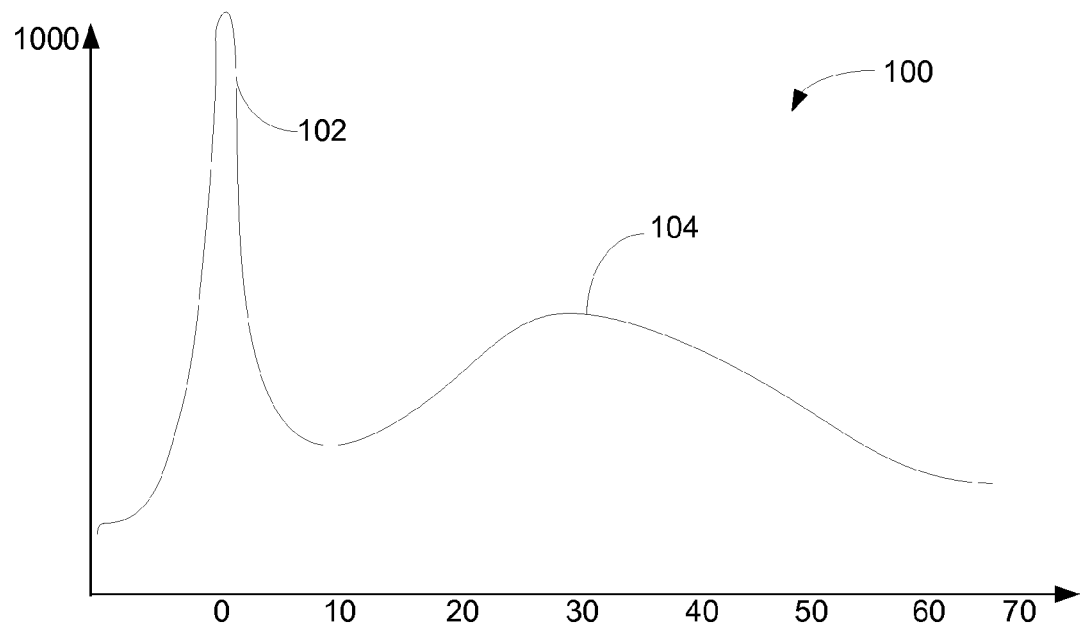
FIG. 1A shows an arbitrary electron energy loss spectrum in the low-loss region of the energy spectrum.
Figure 1B:
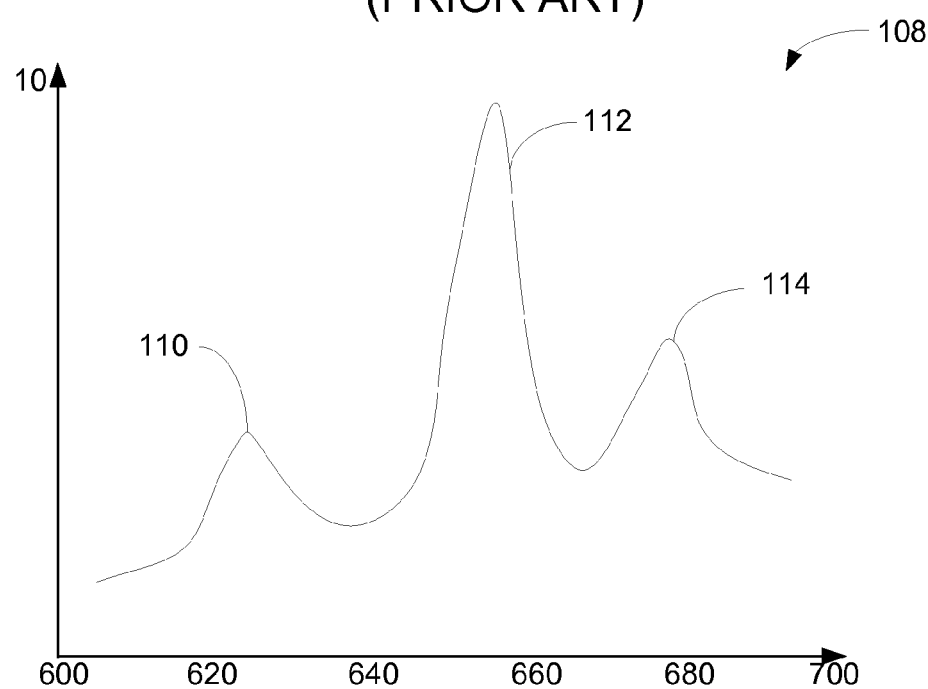
FIG. 1B shows an arbitrary electron energy loss spectrum in a core-loss region of the energy spectrum.
Figure 2A:
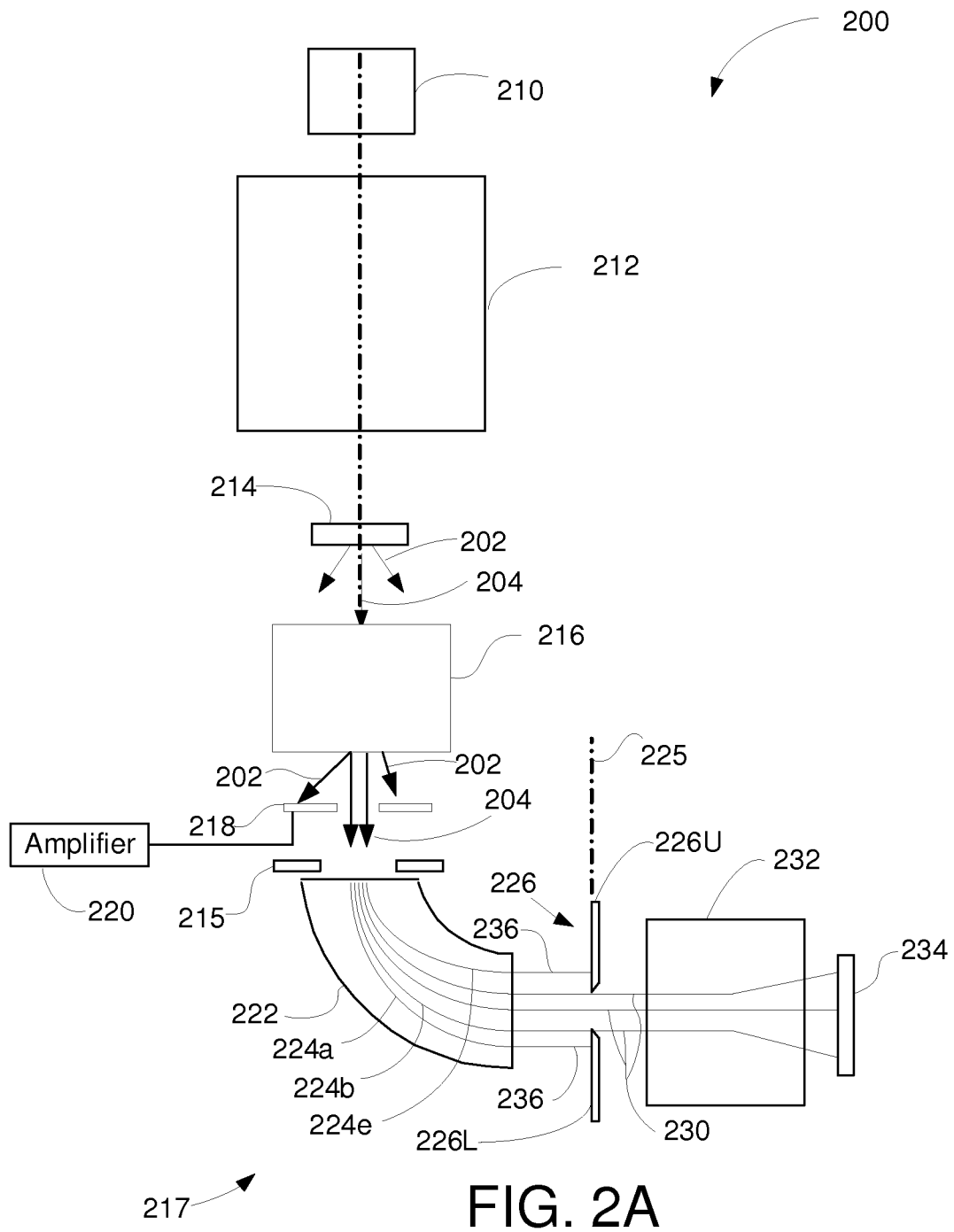
FIG. 2A shows a scanning transmission electron microscope that can perform dark-field STEM detection and EELS.
Figure 2B:
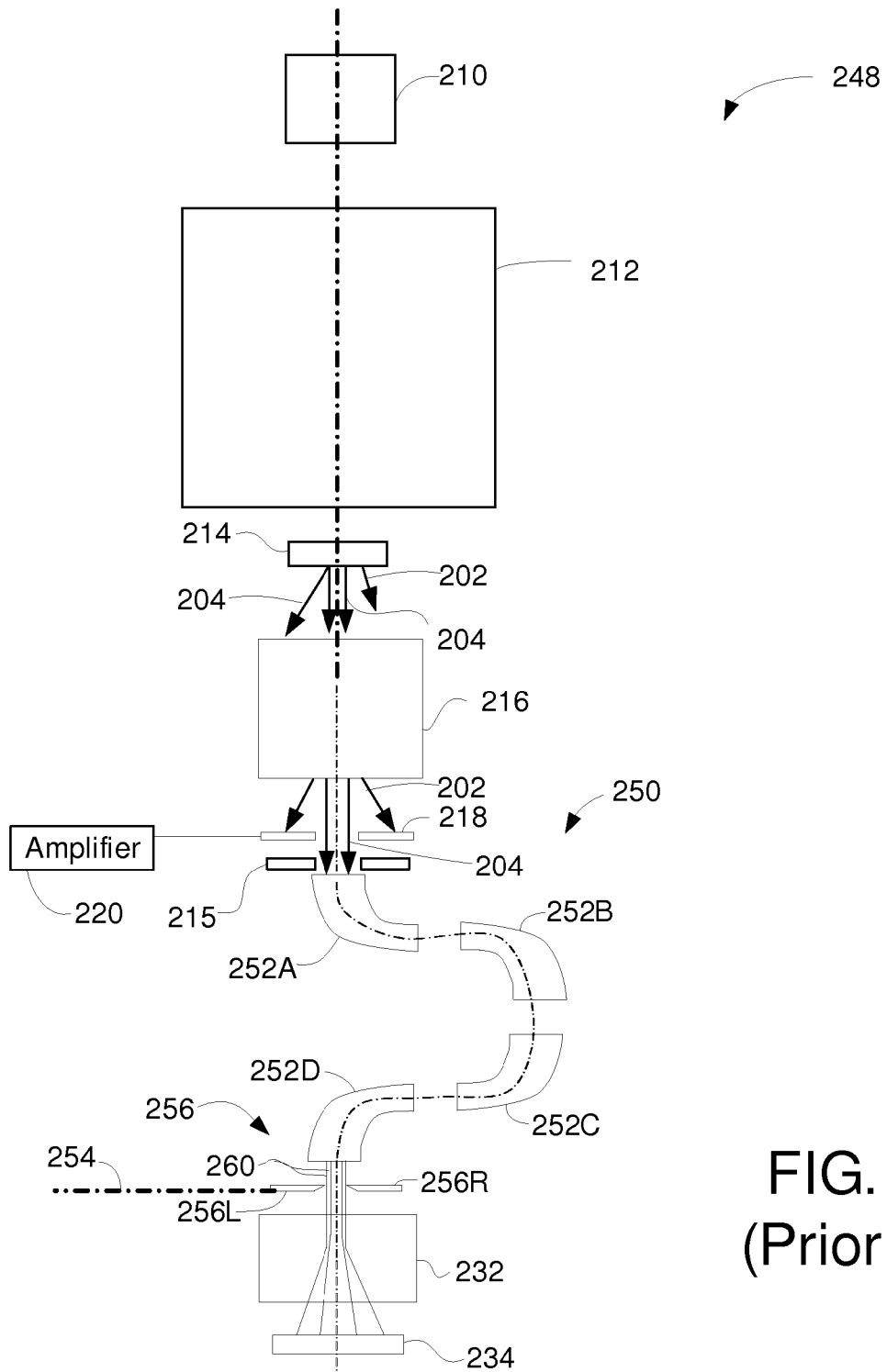
FIG. 2B shows another prior art detector that can perform dark-field STEM detection and EELS.
Figure 3:
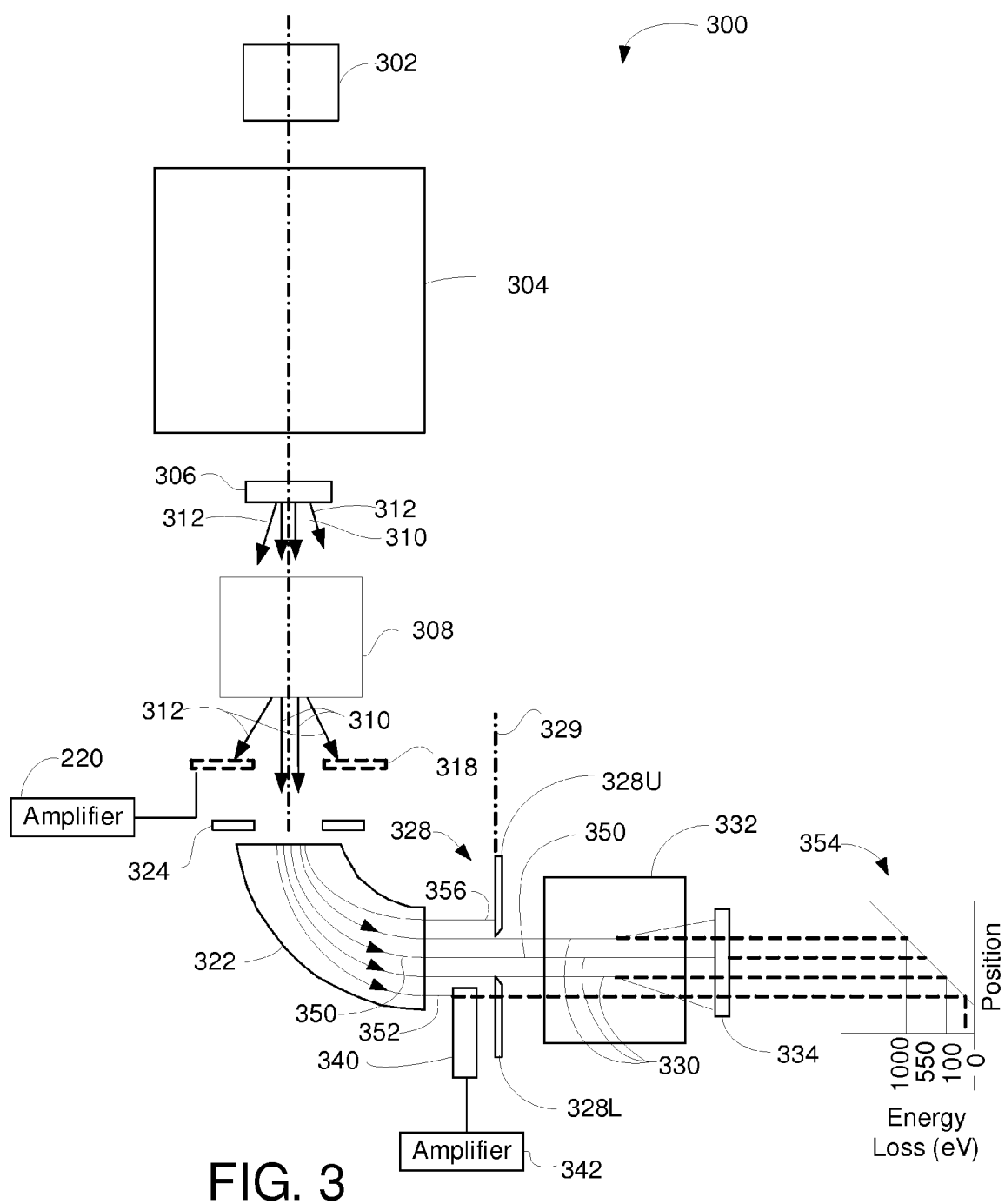
FIG. 3 shows schematically a first embodiment of the present invention that can perform bright-field STEM detection and EELS.

FIG. 3 shows that a preferred transmission electron microscope 300 includes an electron source 302 and a focusing column 304 that focuses electrons from source 302 into a small spot and scans the spot across a thin sample 306. The electrons are typically accelerated to energies of between 50 keV and 1,000 keV. Most electrons that pass through sample 306 enter projection electron optics 308. Projection electron optics 308 magnify the electron image of the sample. In a preferred embodiment of the present invention, projection electron optics 308 are adjusted so that dark-field electrons 312 are directed to an optional dark-field detector 318, and so that bright-field electrons 310 enter dispersion electron optics, that is, prism 322. This prism separates the bright-field electrons into core-loss bright-field electrons 350 which are recorded by a detector 334, and low-loss bright-field electrons 352, which are recorded by a detector 340. In the prior art, the low-loss bright-field electrons 352, which constitute the main fraction of the signal that exits the sample 306, were not detected during EELS.

The collection angle of the system, that is, the largest angle at which electrons scattered by the sample will still be detected, is determined by the size and position of the entrance aperture 324 of the prism 322 and by the setting of the lenses in projection optics 308.

An optional energy-selecting slit 328 includes an upper knife edge 328U and a lower knife edge 328L positioned at or near an energy dispersive plane 329. The gap between the knife edges is adjustable to pass different ranges of electron energies. The knife edges can also be retracted so that they do not block the beam at all. Electrons 330 that pass through energy-selecting slit 328 are projected by imaging electron optics 332 onto a detector 334, such as a film, a fluorescence screen, a CCD detector, or an active pixel sensor that records the spectrum. A STEM detector 340 is positioned in front of energy-selecting slit 328 and connected to an amplifier 342.

The top edge of detector 340 is positioned just below the top of the lower knife edge 328L at its full open position. The exact distance below the top of lower knife edge 328L is not critical, and is determined by practical manufacturing considerations. For example, a system having a detector positioned about 0.4 mm below can be reliably manufactured without extraordinary effort. Detector 340 preferably has a vertical length of between 5 mm and 10 mm. In some embodiments the position of detector 340 is adjustable, that is, it can be moved up or down so that it is impacted by electrons of different energies. It may be moved, for example, as the position of lower knife edge 328L is adjusted. The distance below the lower knife edge at which detector 340 is positioned and the length of detector 340 determine the energies of electrons that detector 340 can collect. The dimensions are not critical, as long as the detector is positioned to collect electron deflected by the prism and the detector is sufficiently long to collect electrons having energies within the desired energy range.

In one preferred embodiment, prism 322 is adjusted to cause a dispersion of about 4 μm/eV at the energy dispersive plane 329 for 300 keV electrons and to cause electrons 350 having an energy loss of about 550 eV to exit the prism along its axis. Zero-loss and low-loss electrons 352 will then be positioned between about 2.2 mm and 1.8 mm below the axis of the spectrometer, and, if the full width of the slit opening is 2.8 mm, between about 0.4 mm and 0.8 mm below the edge of the lower knife edge 328L and will be collected by detector 340. Graph 354 shows the energy loss of electrons leaving the prism 322 at different vertical positions at the exit of prism 322. Dashed lines connect the electron trajectories to graph 354. Dimensions are described herein to provide an example and not to limit the invention; different implementations will use different dimensions.

As described above, a spectrometer can be used in two modes. In a spectroscopy mode, electrons over a relatively wide energy range are admitted through the slit 328 and the imaging electron optics 332 form an image of the plane of the slit at the plane of detector 334 to produce a spectrum. In an energy filtered imaging mode, the energy-selecting slit selects a small range of electron energies, such as a range 10 eV or 20 eV wide, and imaging electron optics 332 forms an image of the entrance plane of the prism at the detector plane using electrons within the narrow energy range. The image at the entrance plane of the spectrometer, and thus the image at the detector, can be an image of the sample or it can be a diffraction pattern, depending on the settings of the projection optics 308. In one spectroscopy mode embodiment, the energy-selecting slit 328 is adjusted to a width that passes electrons having an energy loss of between about 100 eV and about 1000 eV. Those electrons are projected by imaging electron optics 332 onto detector 334. Electrons 356 having energies losses of greater than about 1000 eV will impinge on upper knife edge 328U and will not be detected. Thus, the detector 334 will measure the energy losses of "core loss" electrons having energy losses of between 100 eV and 1000 eV, while detector 340 will detect the number of electrons in the zero-loss peak and other low-loss electrons.

Depending upon the portion of the spectrum that is to be viewed, the prism is typically tuned to cause the center of the energy region of interest to exit the prism along the prism axis. The magnification of imaging electron optics 332 can be adjusted to provide a high energy resolution image of a limited energy range on detector 334, or to provide a lower resolution over a broader range of energies. For example, the prism may be adjusted so that electrons having an energy loss of 500 eV exit along the axis, and the energy-selecting slit may pass electrons having energies of between 495 eV and 505 eV, the image then being magnified by optics 332 to provide a high resolution spectrum within that limited range. Alternatively, the energy-selecting slit may be opened to pass electrons having energy loss of between 100 eV and 1000 eV, the image then being magnified by optics 332 to provide a low resolution spectrum within that broad range.

As the prism is tuned, the position of the zero-loss peak will change. The detector 340 is preferably sufficiently long to detect the zero-loss peak over a broad range of prism tunings, that is, over a broad range of energies aligned with the prism axis at its exit and over a broad dispersal. For example, when the prism is tuned to provide a dispersion of 4 μm/eV at the plane of energy-selecting slit 328, a detector 340 having a length of 10 mm can detect electrons within an energy range of 2,500 eV, allowing the beam energy at the prism axis to be adjusted over a great range, while still detecting the zero-loss peak on detector 340. The position of the detector may also be adjusted so that it intercepts electrons within a desired energy range.

Thus, transmission electron microscope 300 can simultaneously collect dark-field STEM information from optional detector 318, bright-field STEM information from detector 340, and EELS information from detector 334. The data from the electrons in the low-loss region from detector 340 is similar to the data available from bright-field STEM and can be interpreted in a similar manner. For example, the low-loss peak signal can be used to quickly scan a specimen to obtain crystallographic information, such as strain information, while simultaneously observing the EELS spectrum of the core-loss electrons to determine the presence of a particular element.

Figure 4:
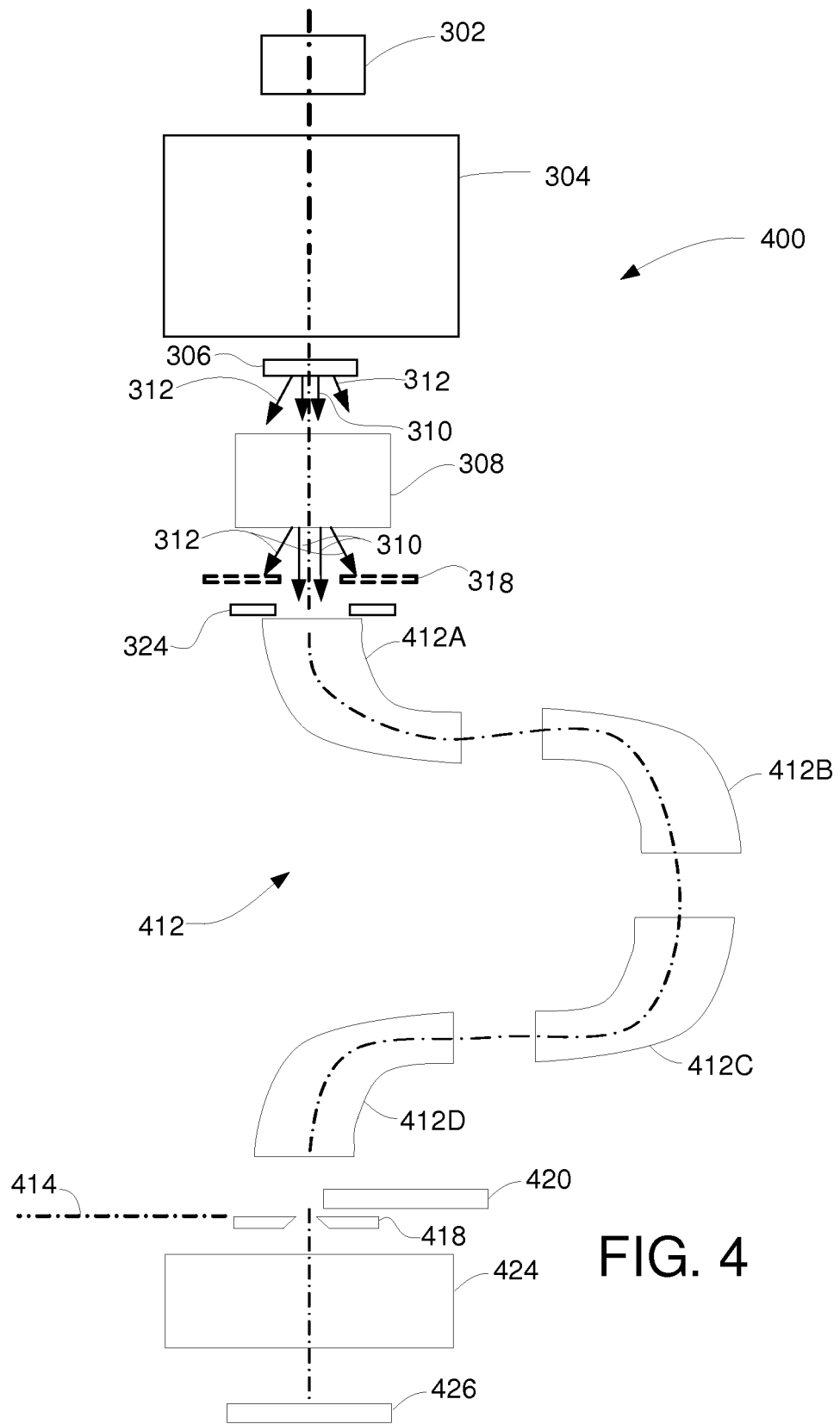
FIG. 4 shows schematically a second embodiment of the present invention that can perform bright-field STEM detection and EELS.

FIG. 4 shows an alternative embodiment of a scanning transmission microscope 400 that uses an in-column spectrometer. Scanning transmission microscope 400 includes an electron source 302 and a focusing column 304 that focuses and scans electrons provided by electron source 302 onto a sample 306. Projection electron optics 308 preferably direct dark-field electrons 312 from the sample 306 to an optional dark-field detector 318 and bright-field electrons 310 into prism 412, which comprises an omega filter that includes segments 412A, 412B, 412C and 412D. Prism 412 disperses electrons from sample 306 in an energy dispersive plane 414 located between segment 412D and imaging optics 424. Prism 412 is adjusted so that low-loss electrons will leave the prism segment 412D off axis and can be detected by a bright-field STEM detector 420, which is positioned at or near the energy dispersive plane 414. Core-loss electrons will pass through optional energy-selecting slit 418 and enter imaging optics 424, which forms an image on a detector 426, the image being either an image of the energy-dispersive plane 414 or an image of the prism entrance plane. Adjustments of prism 412 are similar to the adjustments described above with respect to the post column filter in FIG. 3. The excitation of prism 412, which controls the energy of electrons exiting on its axis and the electron dispersion, can be adjusted to determine the energy range of electrons that impinge on brightfield STEM detector 420 and the range of electron energies that will continue through the imaging optics 424, and be used for EELS.

Figure 5:
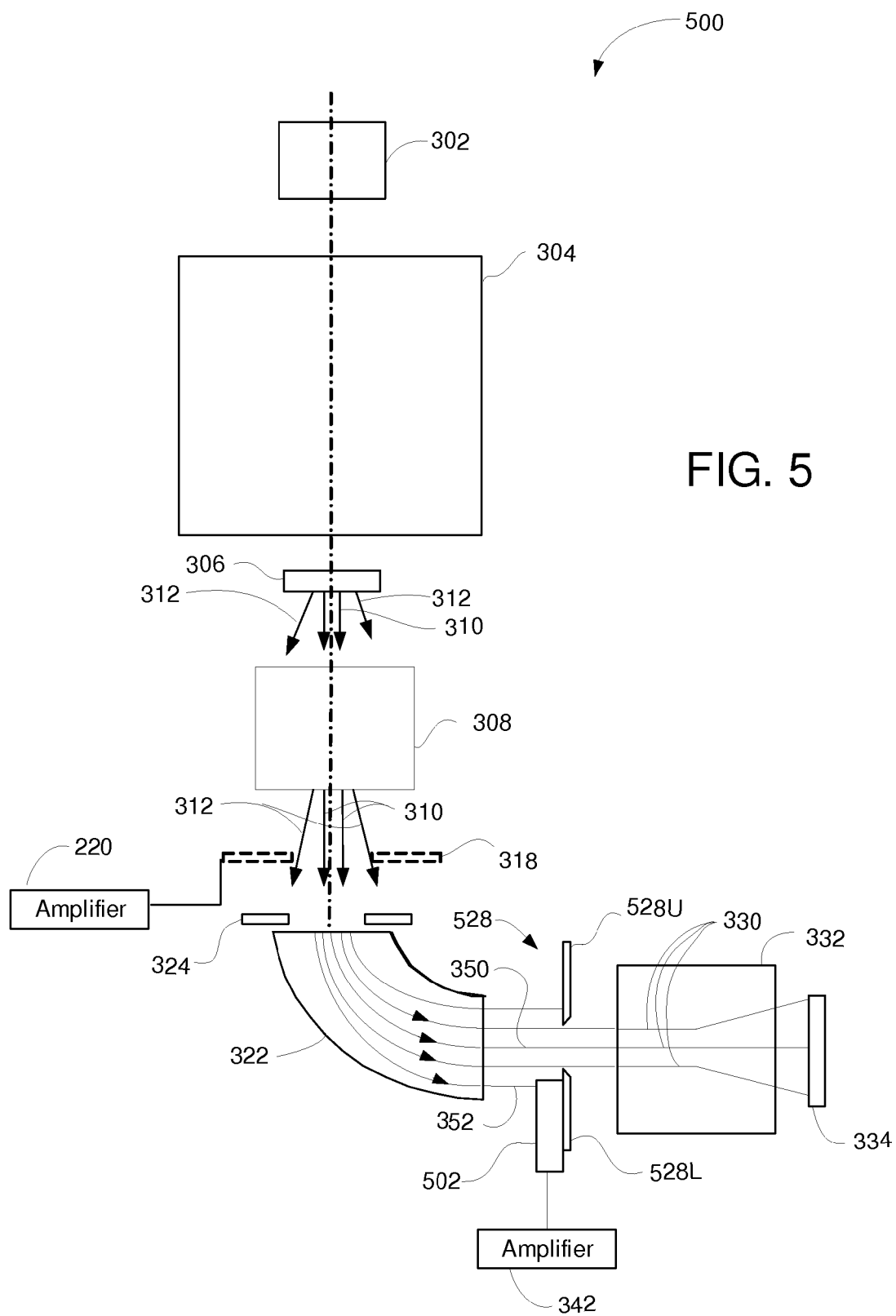
FIG. 5 shows an embodiment of the present invention in which a detector is attached to one side of the energy-selecting slit.
Figure 6:
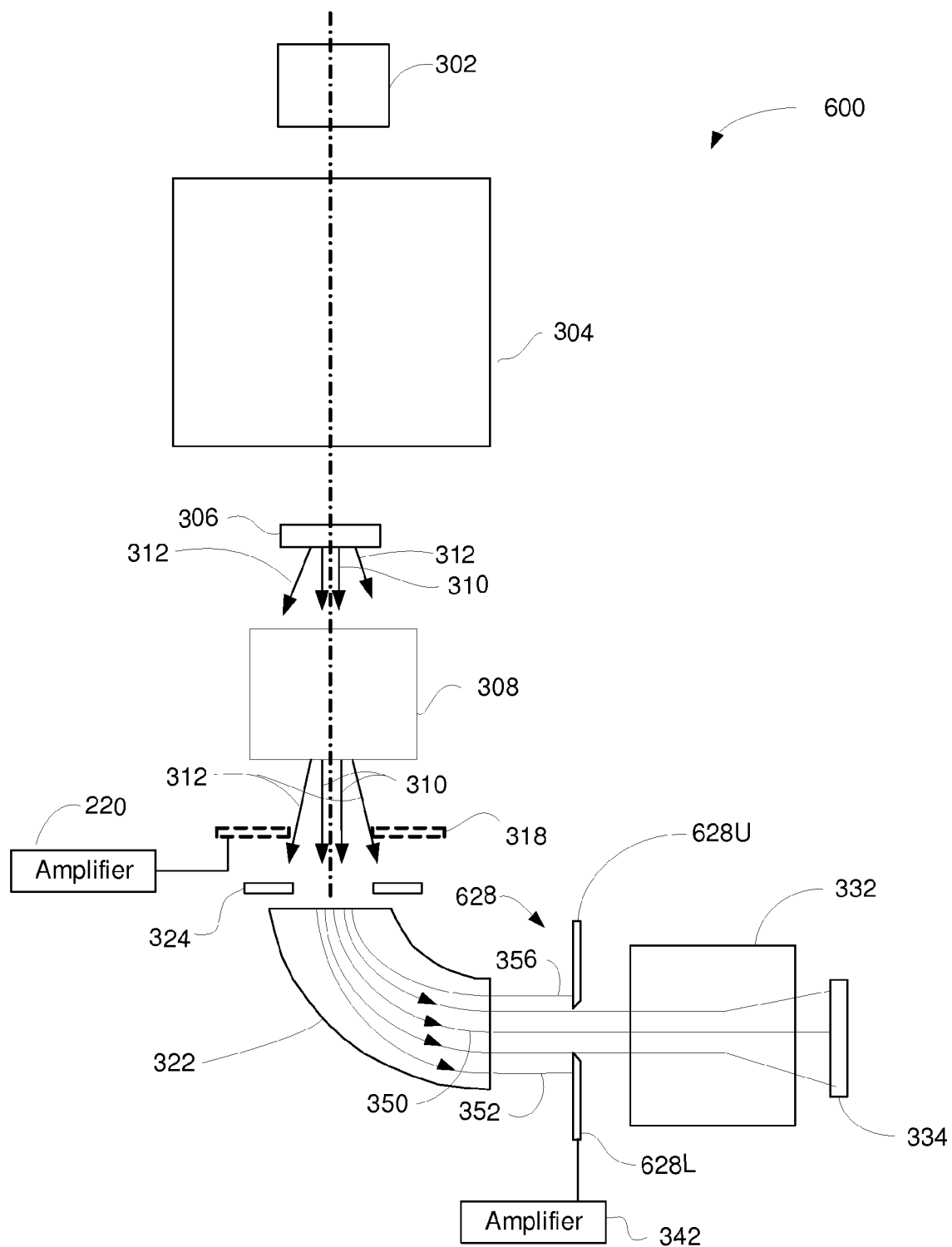
FIG. 6 shows an embodiment of the present invention in which one side of the energy-selecting slit is used as the detector.

FIG. 5 shows an alternative embodiment of a scanning transmission electron microscope 500 in which a detector 502 is attached to the lower knife edge 528L of energy-selecting slit 528. In other respects, scanning transmission electron microscope 500 is similar to scanning transmission electron microscope 300 of FIG. 3. FIG. 6 shows an alternative embodiment of a scanning transmission electron microscope 600 in which a lower knife edge 628L of energy-selecting slit 628 is used as the second detector and is connected to the amplifier. Using the knife edge as a metal electrode for detection may not provide data sufficiently fast for many applications.

Figure 7:
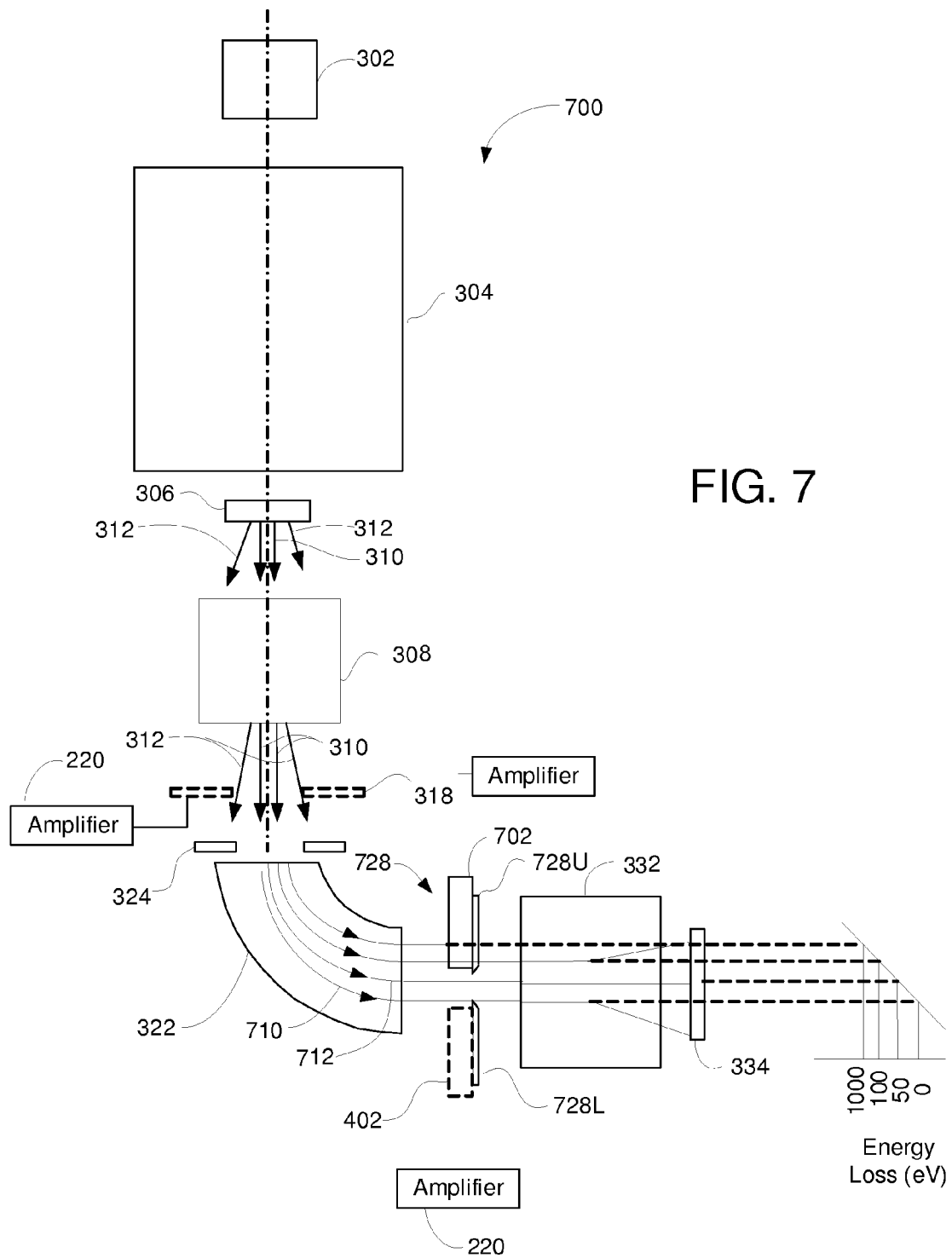
FIG. 7 shows schematically an embodiment that can perform dark-field STEM detection, and bright-field STEM detection on core-loss electrons, and EELS.

FIG. 7 shows an alternative embodiment of a scanning transmission electron microscope 700 in which a detector 702 is attached to the upper energy slit 728U of energy-selecting slit 728. The prism 322 is adjusted so that electrons 710 in the zero-loss peak pass just above the lower knife edge 728L and enter imaging optics 332. Electrons 712 having energies near the center of the low-loss spectral region exit along the axis of prism 322. Thus, the zero-loss and low-loss electrons will be projected by imaging electron optics 332 onto detector 334. Electrons having a higher energy loss will impact detector 702 above the slit opening to provide a core-loss electrons STEM signal analogous to a zero-loss or low-loss STEM signal. For example, electrons having an energy loss of less than 100 eV may pass through energy-selecting slit 728, while electrons having an energy loss of greater than 100 eV pass above the slit and are detected by detector 702. Detector 702 may also be positioned in front of the knife edges, like detector 340 shown in FIG. 3. Detector 702 could also be eliminated; the knife edge 728U can be used as a detector and connected to the amplifiers 220. An optional detector 402 could be attached to lower knife edge 728L, so that the prism 322 can be adjusted to perform EELS on the core-loss electrons and STEM detection for low-loss electrons as described above with respect to FIG. 4.

Simultaneous use of bright-field STEM and EELS provides sample analysis results to the user in a shorter amount of time. By combining analyses, the same information can be obtained with less exposure of the sample to the high energy electron beam.

The ranges of electron energies detected by the various detectors described in the embodiments above are exemplary, and can be varied depending upon the application and the information to be collected.

The STEM detectors used in the embodiments above could also be position-sensitive detectors. Because the position of the electrons after the prism depends on the energy of the electrons, a detector that provides positional information, for example, by being divided into multiple segments, stripes, or pixels could provide spectroscopic information in additional to the spectroscopic information provided from the detector positioned after the imaging optics 332. In some embodiment, the position of the STEM detector is adjustable and can be moved to any desired position to detect any portion of spectrum.

One preferred embodiment includes a source of high energy electrons; an electron focusing column for focusing the electrons from the high energy electron source into a beam and scanning it across the sample; a dispersive device for dispersing electrons of different energies that have passed through the sample; a first electron detector; electron optics for projecting electrons through the slit onto the first detector; a second detector for detecting electrons, in which the first electron detector recording images or spectra by recording electron intensities at multiple points; the second detector rapidly records electron intensity changes over an area as the electron focusing column scans the beam of high energy electrons across the sample; the second detector is positioned in an energy dispersive plane; and the second detector does not block electrons from entering the first detector.

In accordance with some embodiments of the invention, the first detector is a camera, such as a CCD camera or an active pixel sensor camera; and the second detector is a STEM detector.

In accordance with some embodiments of the invention, the dispersive device separates the beam into a first energy range and a second energy range; the first detector detect electrons within the first energy range; and the second detector detects electrons within the second energy range.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A transmission electron microscope comprising:
    a source of high energy electrons;
    an electron focusing column for focusing the electrons from the high energy electron source into a beam and scanning it across the sample;
    a dispersive device for dispersing electron of different energies that have passed through the sample;
    a first electron detector for recording images or spectra by recording electron intensities at multiple points;
    electron optics for projecting electrons onto the first detector; and
    a second detector for detecting electrons, the first and second detectors being constructed and arranged to provide multiple simultaneous analyses of the dispersed electrons, wherein:
        the second detector rapidly records electron intensity changes over an area as the electron focusing column scans the beam of high energy electrons across the sample;

the second detector is positioned in or substantially close to an energy dispersive plane; and the second detector does not block electrons from entering the first detector.

2. The system of claim 1 in which:

the first detector is a camera; and the second detector is a STEM detector.

3. The system of claim 1 in which:

the dispersive device separates the beam into a first energy range and a second energy range;

the first detector detects electrons within the first energy range; and the second detector detects electrons within the second energy range.

4. The system of claim 1 in which the dispersive device includes a prism that can be adjusted so that the first detector detects core-loss electrons and the second detector detects electrons in a zero-loss peak.

5. The system of claim 1 in which the second detector is positioned between the dispersive device and the electron optics for projecting electrons onto the first detector.

6. The system of claim 1 in which the first detector detects electrons having an energy loss of greater than 100 eV and in the second detector detects electrons having an energy loss of less than 100 eV.

7. The system of claim 1 further comprising an energy-selecting slit in or near an energy-dispersive plane and in which the second detector is positioned in front of the energy-selecting slit or in which the detector comprises a portion of the energy-selecting slit.

8. The system of claim 1 further comprising a third electron detector, one of the second or third detectors detecting electrons that pass on one side of the slit and the other of the second and third electron detecting electrons that pass on the other side of the slit.

9. A method of analyzing a sample, comprising:

directing an electron beam toward the sample;

using a dispersive device to separate electrons into a first energy range and a second energy range after the electrons pass through the sample;

detecting electrons in a first energy range in a first detector that determines the energies of the electrons; and characterized by detecting electrons in a second energy range in a second detector positioned after the dispersive device and that produces a signal proportional to the number of electrons in the second energy range for multiple simultaneous analyses of the electrons in the first and second energy ranges.

10. The method of claim 9 in which detecting electrons in a first energy range includes detecting core-loss electrons and in which detecting electrons in a second energy range includes detecting zero-loss electrons.

11. The method of claim 9 in which separating electrons into a first energy range and a second energy range includes passing the electrons through a prism;

in which the second detector is positioned at or in front of a portion of the energy-selecting slit to detect at least some of the electrons that do not pass through the slit.

12. The method of claim 9 in which detecting electrons in a first energy range includes passing electrons in the first energy range through an energy-selecting slit.

13. The method of claim 12 further comprising positioning the second detector at or in front of a portion of the energy-selecting slit to detect at least some of the electrons that do not pass through the slit.

14. The method of claim 12 further comprising detecting electrons that pass on one side of the slit with the second detector and detecting electrons that pass on the other side of the slit with a third detector.

15. The method of claim 9 further comprising:

detecting electrons having an energy loss of greater than 100 eV with the first detector; and detecting electrons having an energy loss of less than 100 eV with the second detector.

\* \* \* \* \*